(12) United States Patent
Mochizuki et al.

(10) Patent No.: US 6,812,494 B2
(45) Date of Patent: Nov. 2, 2004

(54) SEMICONDUCTOR DEVICE

(75) Inventors: Chiori Mochizuki, Kanagawa (JP); Minoru Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/845,284

(22) Filed: May 1, 2001

(65) Prior Publication Data

US 2002/0005520 A1 Jan. 17, 2002

(30) Foreign Application Priority Data

May 8, 2000 (JP) .................................. 2000-135133
Apr. 27, 2001 (JP) .................................. 2001-131171

(51) Int. Cl.[7] .............................................. H01L 29/04
(52) U.S. Cl. ............................ 257/75; 257/72; 257/59
(58) Field of Search ............................ 257/75, 72, 59; 349/164, 42

(56) References Cited

U.S. PATENT DOCUMENTS

| | | | | | |
|---|---|---|---|---|---|
| 5,235,272 A | * | 8/1993 | Henley | ................. | 324/158 |
| 5,329,149 A | * | 7/1994 | Kawahara et al. | .......... | 257/435 |
| 5,337,474 A | * | 8/1994 | Oka et al. | ................. | 29/846 |
| 5,422,293 A | * | 6/1995 | Konya | .................. | 437/50 |
| 5,504,348 A | * | 4/1996 | Yoshida et al. | ............. | 257/59 |
| 5,504,601 A | * | 4/1996 | Watanabe et al. | ............ | 359/59 |
| 5,608,558 A | * | 3/1997 | Katsumi | ................. | 349/192 |
| 5,619,223 A | * | 4/1997 | Lee et al. | ................. | 345/93 |
| 5,811,790 A | * | 9/1998 | Endo et al. | .............. | 250/208.1 |
| 5,985,690 A | * | 11/1999 | Fujikura | ................. | 438/68 |
| 6,295,142 B1 | * | 9/2001 | Watanabe et al. | .......... | 258/482 |
| 6,346,976 B1 | * | 2/2002 | Komeno et al. | ............ | 349/139 |
| 6,509,949 B1 | * | 1/2003 | Lu et al. | ................. | 349/187 |
| 6,573,957 B1 | * | 6/2003 | Suzuki | .................. | 349/73 |
| 6,586,769 B1 | * | 7/2003 | Watanabe et al. | ............ | 257/72 |
| 2003/0079583 A1 | * | 5/2003 | Funakoshi et al. | ........... | 83/13 |
| 2003/0117557 A1 | * | 6/2003 | Fujita et al. | ............... | 349/139 |

FOREIGN PATENT DOCUMENTS

| | | | |
|---|---|---|---|
| EP | 646 830 | * | 10/1994 |
| EP | 993038 | * | 4/2000 |
| JP | 8-62625 | * | 3/1996 |
| JP | 8-274292 | * | 10/1996 |
| JP | 8-320502 | * | 12/1996 |
| JP | 9-289181 | * | 11/1997 |

* cited by examiner

Primary Examiner—Minhloan Tran
Assistant Examiner—Ahmed N. Sefer
(74) Attorney, Agent, or Firm—Fitzpatrick, Cella, Harper & Scinto

(57) ABSTRACT

A semiconductor device with which a panel having a large area or a narrowly margined with the circumferential space minimized can be manufactured stably with a high yield. The semiconductor device comprises a TFT substrate having a plurality of pixels of a plurality of TFT (thin film transistors) provided on the substrate in which a peripheral wire is arranged along the outer periphery of the TFT substrate and connected to a constant potential.

7 Claims, 14 Drawing Sheets

SEMICONDUCTOR DEVICE

BACKGROUND OF THE INVENTION

1. Field of the Invention

This invention relates to a semiconductor device comprising a plurality of functional elements arranged on a substrate.

2. Related Background Art

To date, thin film transistors prepared by using an amorphous silicon thin film for functional elements have a wide variety of applications as switching devices including display devices such as liquid crystal panels and organic EL panels as well as optical sensor panels where they are used in combination with PIN photodiodes comprising an amorphous silicon thin film like TFT elements or photoelectric conversion elements (to be referred to as optical sensor elements hereinafter) such as MIS photocapacitors and TFT optical sensors.

In recent years, efforts have been paid to develop medical applications for optical sensor panels. Particularly, indirect-type radiation imaging apparatus adapted to transform radioactive rays into visible light by means of fluorescent substances to indirectly read the obtained optical information by means of an optical sensor panel and direct type radiation imaging apparatus comprising TFT devices and amorphous selenium to directly transform radioactive rays into electric signals have been developed.

FIG. 15 shows an equivalent circuit diagram of an optical sensor panel comprising TFT elements and PIN photodiodes and FIG. 16 shows a schematic cross sectional view of such an optical sensor panel. In FIG. 15, reference numerals 1010, 1020 and 1030 respectively denote a PIN optical sensor, a TFT and a signal wire, whereas reference numerals 1040 and 1050 respectively denotes a TFT drive wire and a bias wire of the PIN optical sensor.

In FIG. 16, reference numerals 2010, 2020, 2030, 2040, 2050, 2060, 2070 and 2080 respectively denote a glass substrate, a gate wire, a gate insulating film, an i-type a-Si layer, an SiN layer, an n+ ohmic contact layer, a source/drain electrode and a sensor lower-electrode whereas reference numerals 2100, 2110, 2120 respectively denotes P-, I- and N-type a-Si layers. Reference numeral 2090 denotes a sensor upper-electrode and reference numeral 2130 denotes an SiN protection film.

The incoming beam that is carrying image information is subjected to photoelectric conversion by the PIN optical sensor 1010 and its electric charge is stored in a sensor capacity C1. Subsequently, when the TFT 1020 is turned on, the electric charge is distributed to a capacity C2 formed at the crossing of the signal line 1030 and the TFT drive wire 1040 so that the change in the potential of the signal line 1030 is read and output.

Currently, improvements are required of the above-described optical sensor panels in terms of substrate size and process precision in order to meet the demand for a larger display area and a higher degree of definition. However, any such improvements may inevitably entail a huge amount of investment in plant and equipment and a long introductory pre-operational period so that doubts may be cast on such an idea.

In view of this problem, there have been proposed semiconductor devices adapted to produce a large display area by bonding a plurality of relatively small panels. Such semiconductor devices may be realized by using existing plants and equipment for manufacturing small substrates.

FIG. 17 is a schematic perspective view of a radiation image reading apparatus having a large display area and formed by bonding four optical sensor panels. FIG. 18 is a schematic cross sectional view of the device of FIG. 17. In FIG. 17, reference numerals 3010, 3020, 3050, 3060 and 3400 respectively denote an optical sensor panel, a base, a fluorescent panel, a flexible substrate and a chassis.

Referring to FIG. 18, the base 3020 is used to rigidly hold four optical sensor panels 3010 and typically made of lead that absorbs radioactive rays and protects the electric components arranged therebelow. The sensor panels 3010 are bonded to the base 3020 by way of a first adhesive layer 3030, while the fluorescent panel 3050 for transforming radioactive rays into visible light is bonded to the sensor panels 3010 by way of a second adhesive layer 3040. In FIG. 18, reference numeral 3070 denotes a printed substrate for driving the sensor panels and reference numeral 3060 denotes a flexible substrate for connecting the printed substrate 3070 and the sensor panels 3010.

In FIG. 18, there are also shown a cabinet 3200, a lid 3210, a cover 3230 typically made of lead and adapted to protect the electric components, feets 3240 for rigidly securing the printed substrate 3070 and angles 3250 firmly securing the base 3020 to the cabinet 3200. Note that the chassis 2400 comprises members denoted by 3200, 3250. A sensor unit is formed by firmly securing the radiation sensor 3300 within the chassis.

However, when bonding a plurality of panels in a manner as described above, the precision level of the boundaries and that of the clearances separating them are of vital importance.

FIG. 19 is a schematic plan view of four bonded panels. FIG. 20 is an enlarged schematic plan view of a central part of the four bonded panels of FIG. 19, illustrating the boundaries of the panels. In FIG. 20, P denotes the pitch of arrangement of pixels and Pc denotes the distance between the centers of two pixels that belong to different panels and are arranged adjacently relative to each other. In general, correction by way of image processing can properly be carried out, when Pc<2P or the clearance between two panels is made to be less than the size of one pixel. In other words, each sensor panel has to be cut with a margin of several tens of micrometers from the edges of the pixels.

Any attempt for meeting the above requirement is accompanied by the problems as listed below and can end up with a poor manufacturing yield and a poor performance unless they are solved to a satisfactory extent.

1. Some of the pixels of an optical sensor panel can be adversely affected by a cutting operation due to problems such as chipping and/or displacement. Then, the reliability of the sensor panel is lowered after assembling. FIG. 21 is a schematic plan view of a cut area of a sensor panel comprising a pixel 4010 and a protection film 4020 typically made of SiN. In FIG. 21, 4030 denotes a notch formed typically by chipping and 4040 denotes an end facet produced by the cutting. As seen from FIG. 21, the protection film 4020 is partly damaged by notches 4030. As a result, although the sensor panel operates properly in the initial stages, it has been confirmed that its output fluctuates when it is subjected to high temperature and high humidity.

2. Pixels can be destructed by static electricity appearing in the course of assembling of the panels. Normally, insulating items such as glass substrates can become electrically charged with ease when peeled off in a vacuum chuck stage and/or scrubbed by blown air. When the panel is just brought close to an object having an electric potential difference such as a grounded cabinet, an electric discharge occurs to destroy some or all of the pixels of the panel, particularly those arranged at the corners. Then, a poor manufacturing yield can result.

3. A pixel of the assembled sensor panels can be destroyed along the cut edges, particularly at the corners, when static electricity is accumulated to 2 to 3 kV in the course of handling the panels in the assembling process.

SUMMARY OF THE INVENTION

In view of the above identified problems, it is an object of the present invention to provide a semiconductor device with which a panel having a large area or a narrowly margined panel with the circumferential space minimized can be manufactured stably with a high yield.

More specifically, it is a first object of the present invention to provide a semiconductor device provided with a slice check wire for determining the acceptability of the operation of cutting the panels in order to ensure that the panels to be bonded are cut and bonded accurately, said slice check wire being located at a position with which reliability can be secured to electrically check any possible damages such as chippings to the protection film and other components produced in the cutting process in order to secure the reliability of the product after the assembling process.

A second object of the present invention is to provide a semiconductor device in which any electric cross talks are suppressed by fixing the electric potential of the slice check wire to a constant level.

A third object of the present invention is to provide a semiconductor device having an anti-charge feature for securing the stability and the reliability of the device, which can be achieved by electrically connecting the slice check wire to the drive wires of TFTs or the bias wires of the optical sensor in order to improve the resistance against electrostatic discharge failures and also by fixing the electric potential of the slice check wire to a constant level.

According to the invention, the above objects are achieved by providing a semiconductor device comprising a TFT substrate having a plurality of pixels of a plurality of TFT (thin film transistors) provided on the substrate, slice lines for cutting the TFT substrate being arranged along the periphery of said TFT substrate, peripheral wires being arranged between said slice lines and said TFT substrate.

Preferably, said peripheral wires are connected to at least the drive wires or the signal wires of said TFTs. Preferably, each pixel of said TFT substrate comprises a TFT element and a photoelectric conversion element and said peripheral wires are electrically connected to the bias wires of the photoelectric conversion element.

DETAILED DESCRIPTION OF THE PREFERRED EMBODIMENTS

Now, the present invention will be described in greater detail by referring to the accompanying drawings that illustrate preferred embodiment of the invention.
(First Embodiment)

Figure 1:
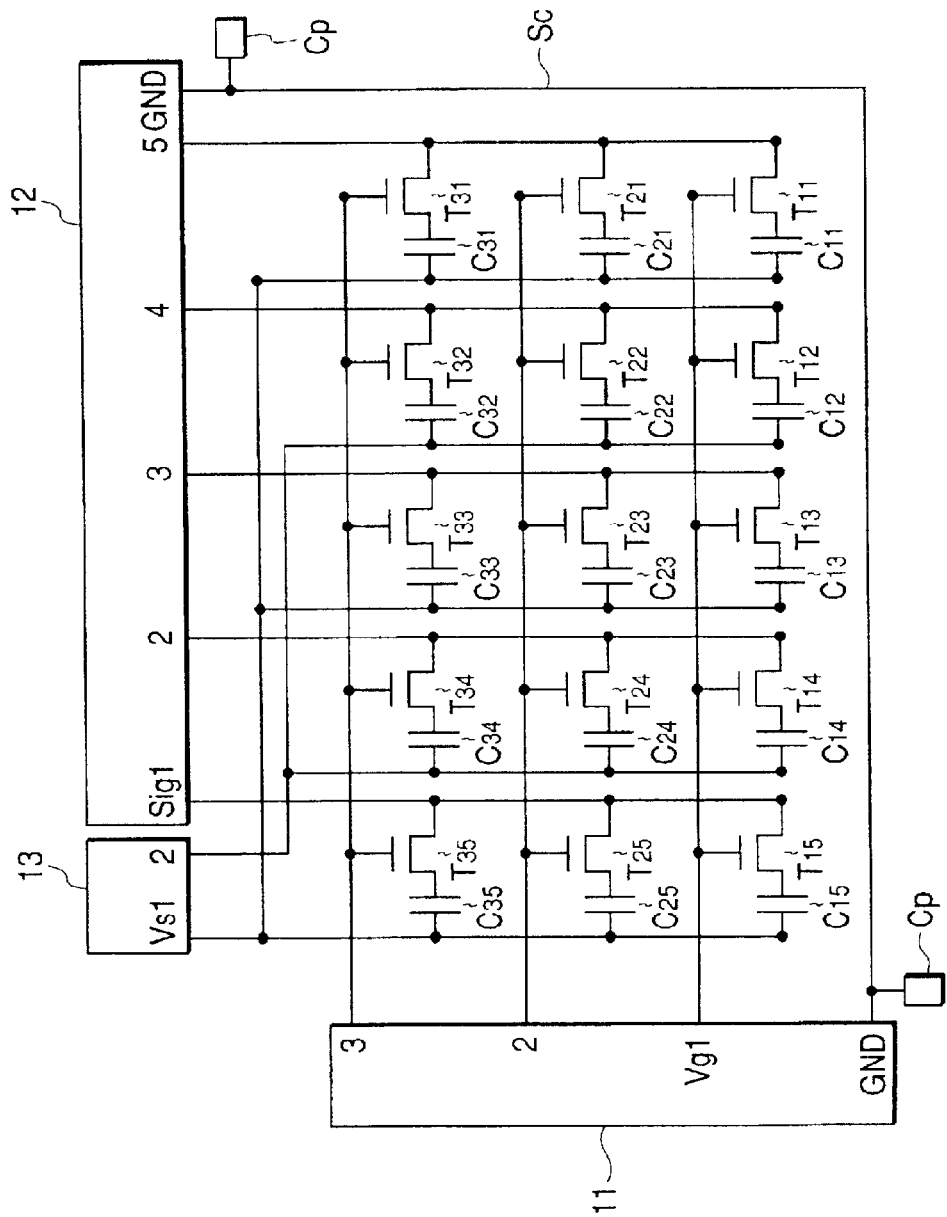
FIG. 1 is a schematic circuit diagram of an equivalent circuit of a first embodiment of the invention.

The first embodiment of a semiconductor device according to the invention will be described which comprises TFT elements and MIS optical sensors and are applied to a radiation image reading apparatus. FIG. 1 is a schematic circuit diagram of an equivalent circuit of a first embodiment of the invention. In FIG. 1, reference numerals 11, 12 and 13 respectively denote a driver for driving a TFT, a signal processing amplifier and another driver for driving an MIS optical sensor. FIG. 1 also shows MIS sensors C11 through C35, TFTs T11 through T35, TFT drive wires Vg1 through Vg3, signal wires Sig1 through Sig5 and bias wires Vs1 and Vs2.

The MIS optical sensors C11 through C35 are provided to receive optical signals to be applied to the bias wires Vs1 and Vs2 from the driver 13. The electric charges of each optical signal is stored in the MIS optical sensor. The accumulated electric charges are then sequentially read out by the TFTs (T11 through T35) by way of the signal lines Sig1 through Sig5 and the signal processing amplifier. The TFTs are sequentially turned on/off by signals applied thereto by the TFT driver 11 by way of the TFT drive wires Vg1 through Vg3. In FIG. 1, Sc denotes a slice check wire whose electric potential is held to the ground level by the TFT driver and the MIS optical sensor driver.

Now, the preparing steps of the embodiment will be briefly described by referring to FIGS. 2A through 2E, showing schematic cross sectional views of an optical sensor panel.

Figure 2A:
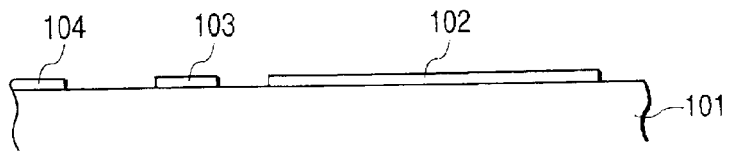
FIGS. 2A, 2B, 2C, 2D and 2E are schematic cross sectional views of the panel section of the first embodiment of the invention including TFTs and photoelectric convesion elements, illustrating different manufacturing steps.

(1) As shown in FIG. 2A, a Cr film is formed on a glass substrate 101 to a thickness of 1,000 Å by sputtering and then lower electrodes 102 of the MIS optical sensors, gate electrodes 103 and gate wires 104 of the TFTs, slice lines for cutting the panel and slice check wire are provided there by means of a patterning operation.

Figure 2B:
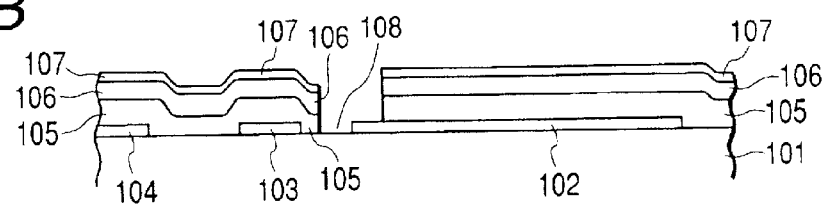

(2) Then, as shown in FIG. 2B, a silicon nitride (SiN) film 105, an amorphous silicon (Si) film 106, an ohmic (n+) layer 107 are successively formed by plasma CVD to respective thicknesses of 3,000 Å, 5,000 Å and 1,000 Å and then contact holes 108 for connecting the lower electrodes of the MIS optical sensors and the TFTS-D electrodes and those for drawing wires are provided typically by CDE.

Figure 2C:
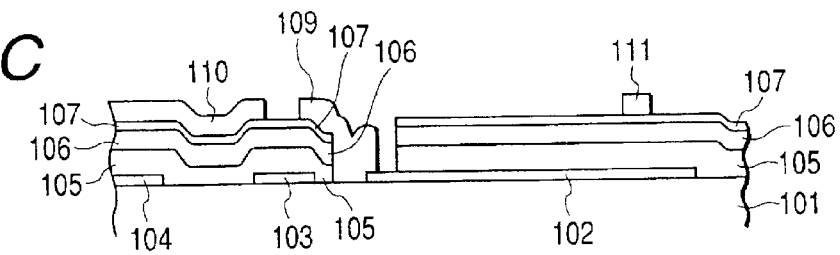

(3) Thereafter, as shown in FIG. 2C, an aluminum (Al) film is formed by sputtering to a thickness of 1 μm and TFTS-D electrodes 109, signal lines 110 and bias wires 111 of the optical sensors are formed there by way of wet etching.

Figure 2D:
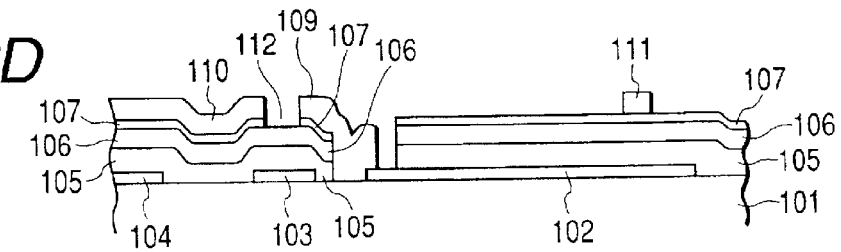

(4) Subsequently, as shown in FIG. 2D, the ohmic (n+) layer 107 at the TFT gap is removed by means of RIE to form a TFT channel 112.

Figure 2E:
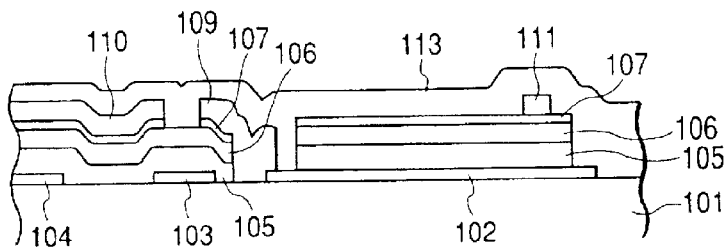

(5) Then, as shown in FIG. 2E, the panel is processed for element isolation and a silicon nitride (SiN) film 113 is formed as a protection film by plasma CVD to a thickness of 9,000 Å. Thereafter, openings are formed therethrough for the pads of the drawn wires typically by RIE.

As a result of the above steps, a single panel is produced and then checked for any defects to determine if the panel is acceptable or not, thereby completing the early stage of the process.

Then, in the middle stage of the process, the components of the optical sensor panel are electrically mounted.

(6) Polyimide is applied by spin coating and then cured by heat. Subsequently, the panel is cut along the slice lines to predetermined dimensions.

(7) The conductivity of the slice check wire is examined.

(8) Electric connections including TAB connections and PCB connections are established and subsequently the slice check wire is checked again for electric conductivity.

With the above steps, modules to be bonded together are produced. Then, in the final stage of the process, they are assembled to produce a large panel.

(9) The panels are bonded to the base and then a fluorescent panel is bonded thereto. Thereafter, an Al sheet is bonded.

(10) The resulting assembly is housed in a cabinet and subjected to a final examination.

Thus, a complete semiconductor device to be used for a radiation image reading apparatus is produced. Since the risk of damage due to static electricity is reduced after connecting the drivers, the slice check wire may be cut and removed after mouting the drivers in position, although it may be left there if it does not give rise to any problem.

Figure 3:
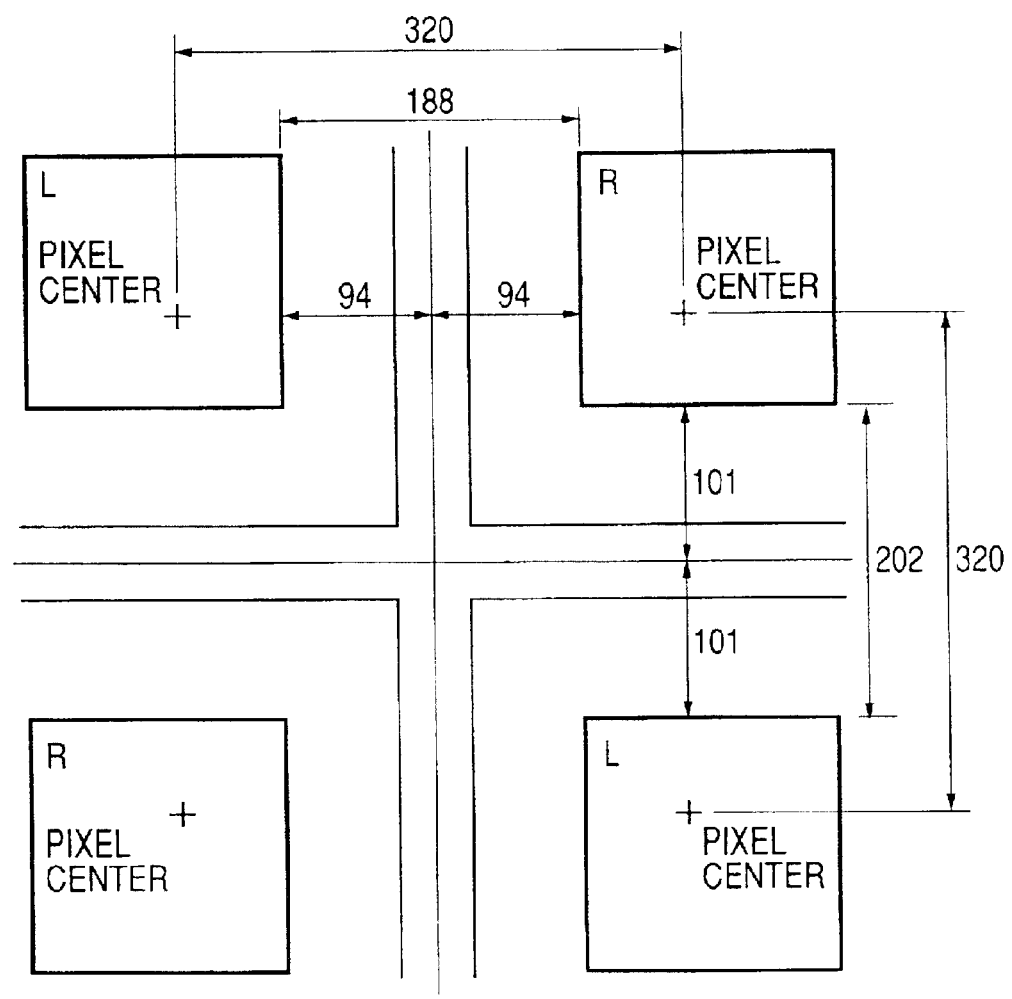
FIG. 3 is an enlarged schematic plan view of a central part of the four bonded panels of the first embodiment, illustrating the boundaries of the panels.

FIG. 3 is an enlarged schematic plan view of a central part of the four bonded panels of the first embodiment, illustrating the boundaries of the panels. The pixel size of this embodiment is 160 μm. In FIG. 3, the center of pixel refers to the center of gravity of the optical sensor, which agrees with the optical center of the pixel. Therefore, so far as the distance separating the centers of any two adjacently located pixels of two adjacent panels is smaller than the size of two pixels or 320 μm, the area to be used for the bondig can be increased so that the panels can be cut safely. This can be achieved when the centers of the optical sensors are positioned toward the center of the bonded panels by appropriately arranging TFTS. With this embodiment, the distance separating the pixel regions of two adjacent panels can be increased from 160 μm to 188 μm or 202 μm.

Figure 4:
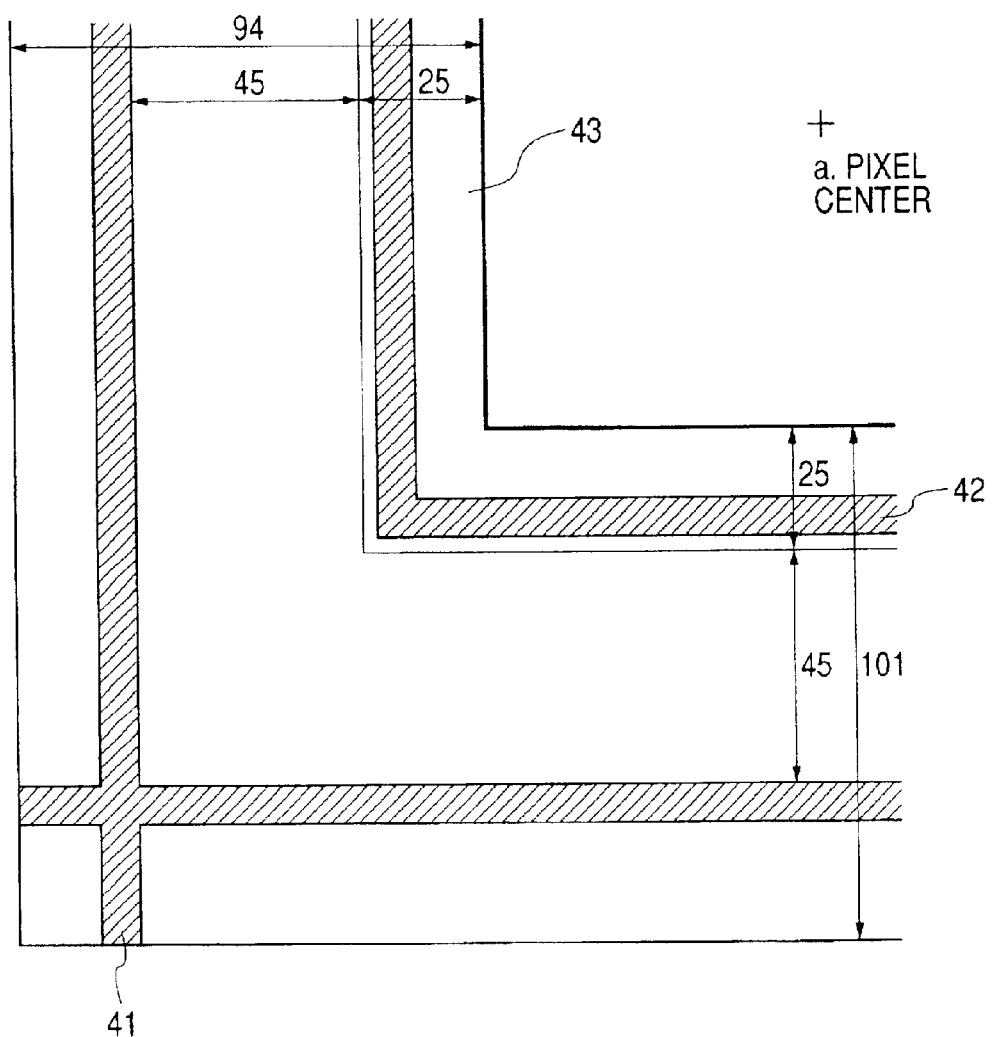
FIG. 4 is an enlarged schematic plan view of one of the panels of the first embodiment, illustrating a corner thereof.

FIG. 4 is an enlarged schematic plan view of one of the panels of the first embodiment, illustrating a corner thereof. In FIG. 4, reference numerals 41, 42 and 43 respectively denotes a slice line, a slice check wire and an SiN protection film, whereas point "a" shows the center of gravity of the pixel.

The SiN protection file 43 is separated from the edges of the pixel by 25 μm and the slice check wire 42 is arranged in the SiN protection film with the minimal width to secure its performance in a reliability test under high temperature/high humidity. The panel is sliced so as to cut off the slice lines. Note that the slice liens are separated from the corresponding respective edges of the SiN protection film by 45 μm to provide a margin for accommodating it to any displacement of chipping or slicing. The margins are made free from the SiN protection film, because, if cracks appear in the SiN protection film, they can be extended to the pixel.

How, the slice check line of this embodiment is used will be discussed below. As pointed out above, if the SiN protection film is damaged by any unexpected displacement due to slicing or chipping, the slice check line can also be damaged. However, by checking electric conductivity by means a pad Cp arranged on the slice check wire shown in FIG. 1, any abnormal condition of the panel is detected so that any defective sensor panels can be prevented from being mingled with good ones.

As a result, it is now possible to by far reliably detect defective devices if compared with conventional visual examination processes. Additionally, it is also possible to examine each device by means of the slice check wire at significant points in the subsequent steps so that absolutely no defective devices may be detected after bonding a plurality of optical sensor panels for each device.

Particularly, since pixel destructions due to static electricity can occur anytime until the TFT driver and the photoelectric conversion element driver are mounted and become electrically operable, the examination using the slice check wire may have to be repeated until that time.

While the above embodiment is described in terms of TFTs used as functional elements, the present invention is by no means limited thereto and the TFTs may be replaced by diodes or thin film diodes.

(Second Embodiment)

Figure 5:
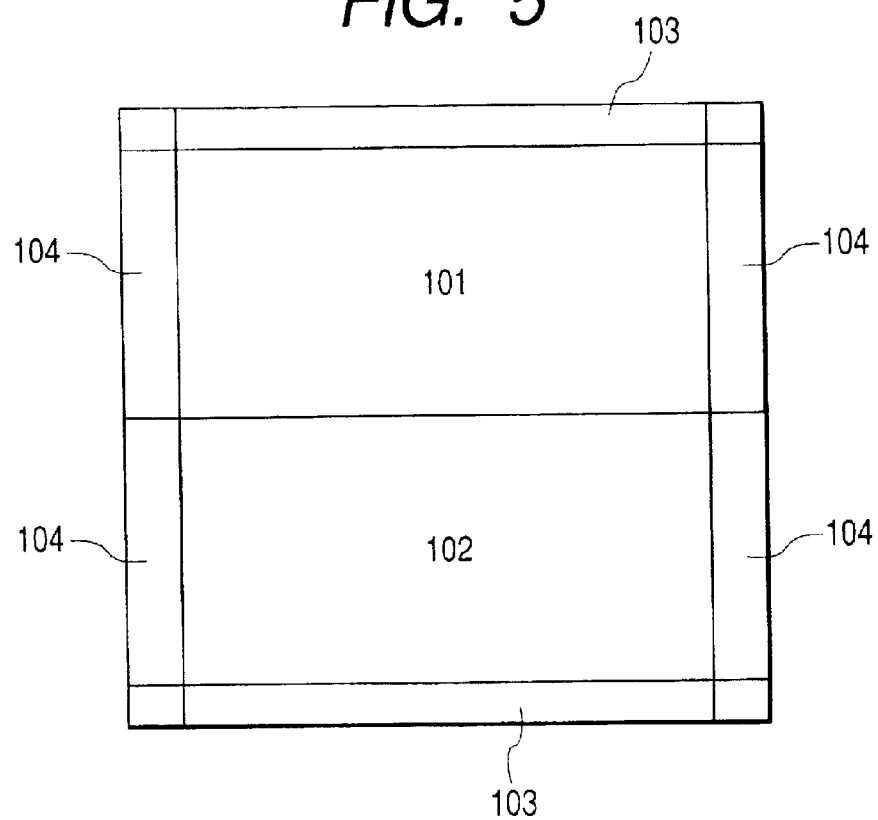
FIG. 5 is a schematic plan view of bonded panels of a second embodiment of the invention.

While the circuits for driving the elements of the first embodiment are arranged only on are side of the substrate, this embodiment is provided with drive circuits arranged on both sides of the panel in order to perform a high speed drive operation. In this embodiment, a pair of sensor panels are bonded together. FIG. 5 is a schematic plan view of the panel section of a second embodiment of the invention, illustrating how panels are bonded. In FIG. 5, reference numerals 101, 102 denotes respective sensor panels and reference numeral 103 denotes an amplifier side leading wire connected to an amplifier IC, whereas reference numeral 104 denotes a driver side leading wire connected to a driver IC. For each of the sensor panels of this embodiment, a driver side leading wire is arranged on each side of the panel to realize a high speed drive operation.

Figure 6:
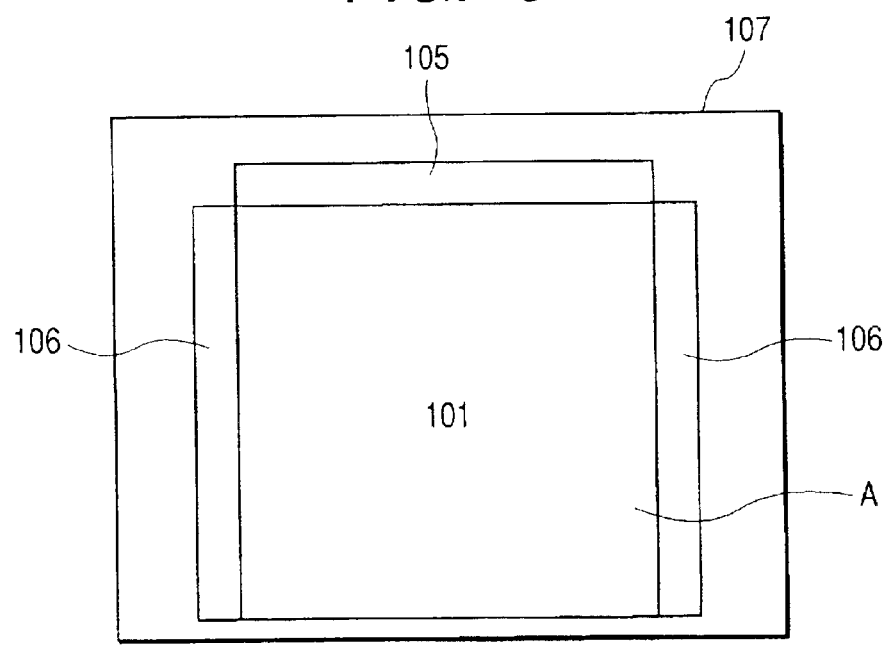
FIG. 6 is a schematic plan view of a single panel of the second embodiment.

As in the case of the first embodiment, after a slice check wire is arranged along the periphery of the TFT substrate and cut at the slice lines, it is possible to check the electric conductivity to detect any defective device. If a single sensor panel has dimensions sufficiently large for forming a semiconductor device, no bonding operation is required and hence the drivers may be arranged on both sides of the panel. If it is desirable to locate the pixel region extremely near the chassis, a single sensor panel is used in which the cutting section is arranged in the direction that is required. Then, pixels may be read in areas close to the chassis. FIG. 6 is a schematic plan view of the panel section of the second embodiment realized by using a single panel. In FIG. 6, there are shown a signal reading circuit 105, a sensor drive circuit 106 and a chassis 107. As seen from FIG. 6, it is possible to arrange a peripheral pixel area A close to the chassis and to read the image in the region close to the chassis.

While the above embodiment is described in terms of TFTs used as functional elements, the present invention is by no means limited thereto and the TFTs may be replaced by diodes or thin film diodes.

(Third Embodiment)

Figure 7:
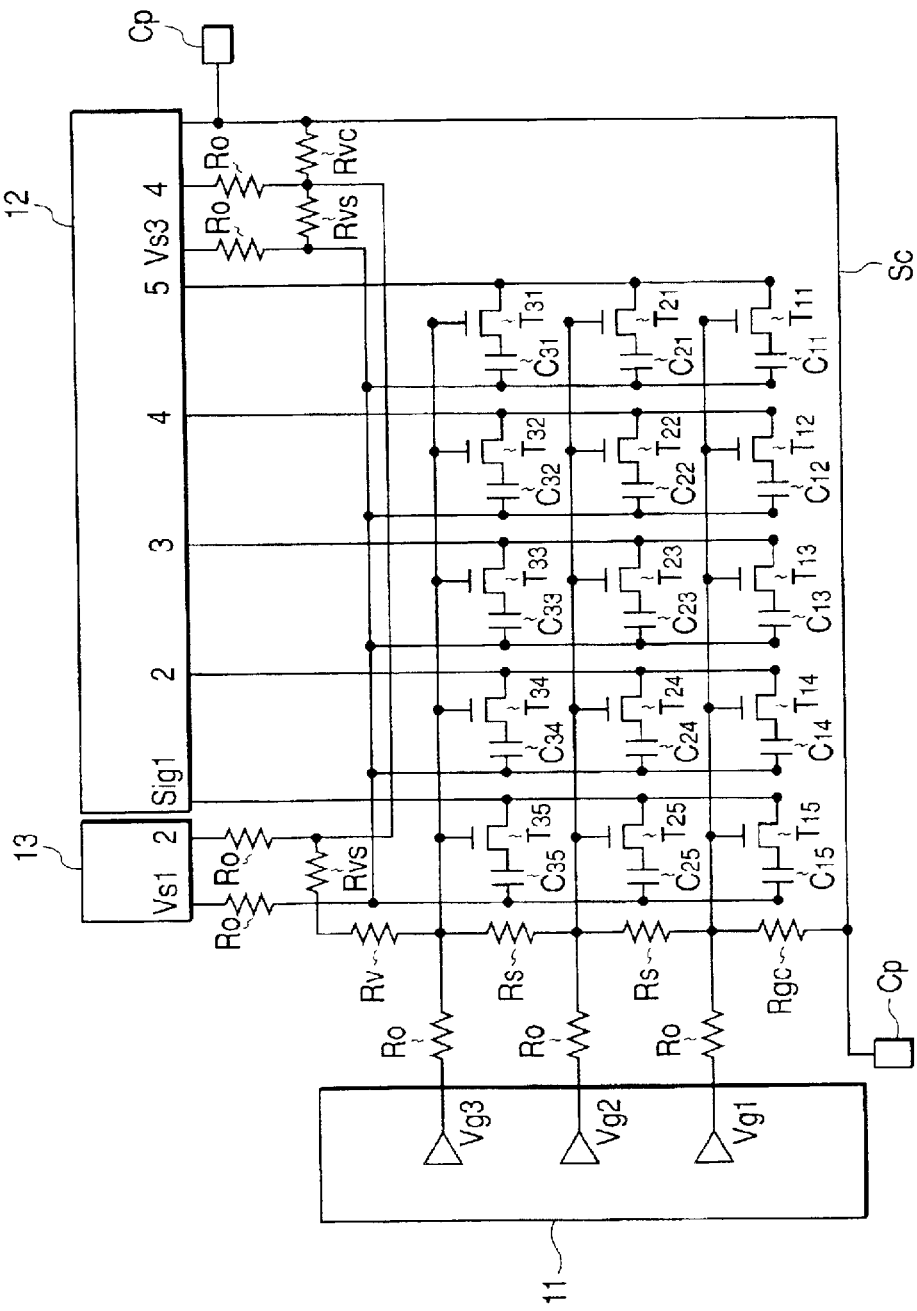
FIG. 7 is a schematic circuit diagram of an equivalent circuit of a third embodiment.

The third embodiment of semiconductor device is applied to a radiation image reading apparatus and comprises TFT elements and MIS photoelectric conversion elements. FIG. 7 is a schematic circuit diagram of an equivalent circuit of the second embodiment. In FIG. 7, reference numeral 11 denotes a TFT driver and reference numeral 12 denotes a signal processing amplifier, whereas reference numeral 13 denotes an MIS photoelectric conversion element driver.

Figure 8:
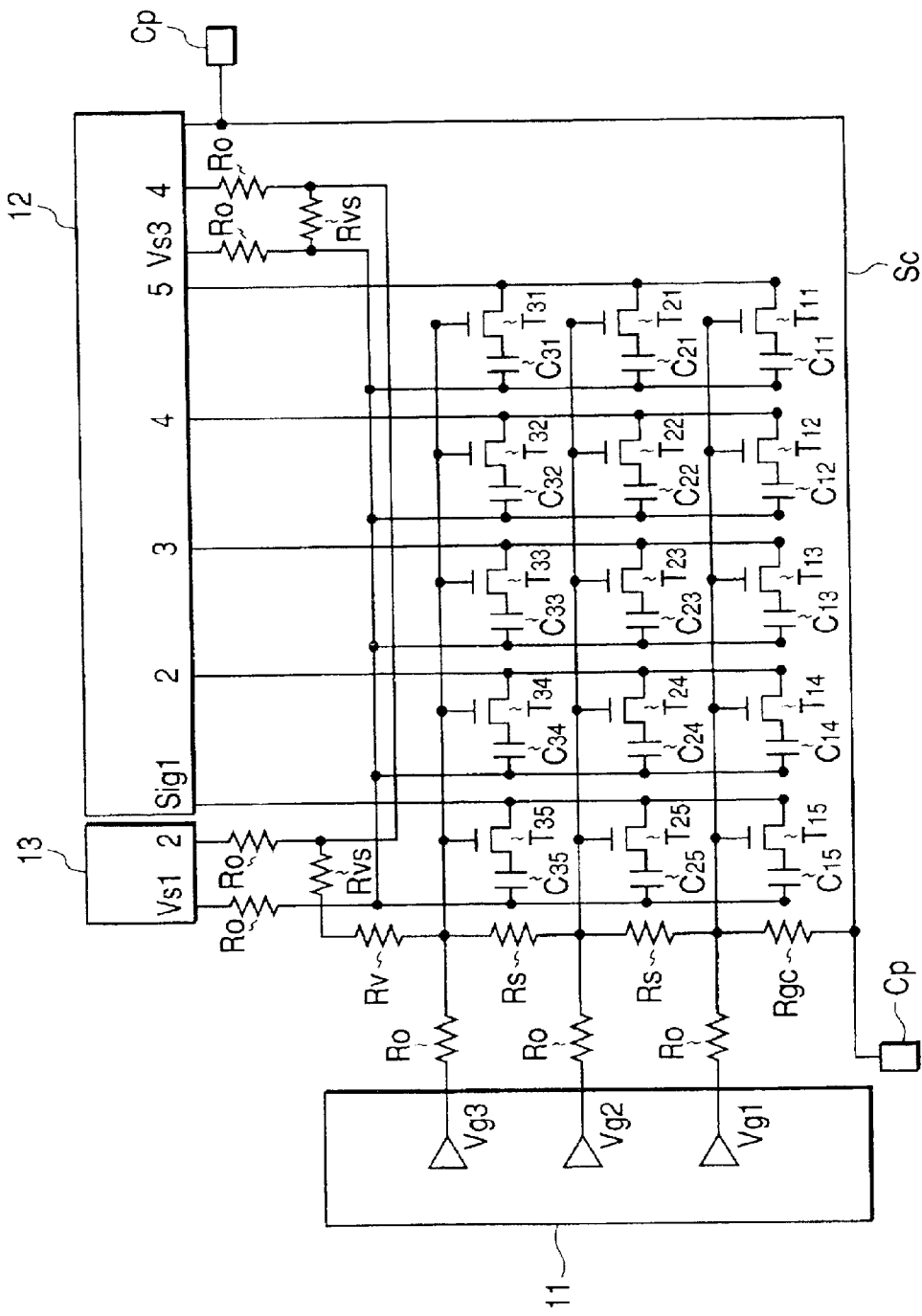
FIG. 8 is a schematic circuit diagram of another equivalent circuit of the third embodiment.

In this embodiment, wires Vs1, Vs2, which are bias wires of optical sensors, are connected to each other by way of resistance Rvs. Additionally, TFT drive wires Vg1 through Vg3 are connected to each other by way of resistance Rs, while wires Vs1 and Vg1 are connected to each other by way of resistance Rv. Slice check wire Sc is connected to wire Vs4 by way of resistance Rvc and to wire Vg1 by way of resistance Rgc. Alternatively, it may be connected to the signal lines or only to the TFT drive wires as shown in FIG. 8. While not shown, it is also possible to connect it only to the bias wires.

If the resistance between the TFT driver and the first TFT is set to Ro and the resistance between the Vg wires is set to Rs, a resistance with which the ON voltage Vgh applied to the Vg wires does not affect any adjacent lines may be selected for the resistance Rs. Note that the adjacent lines are held to the OFF voltage Vgl.

Figure 9:
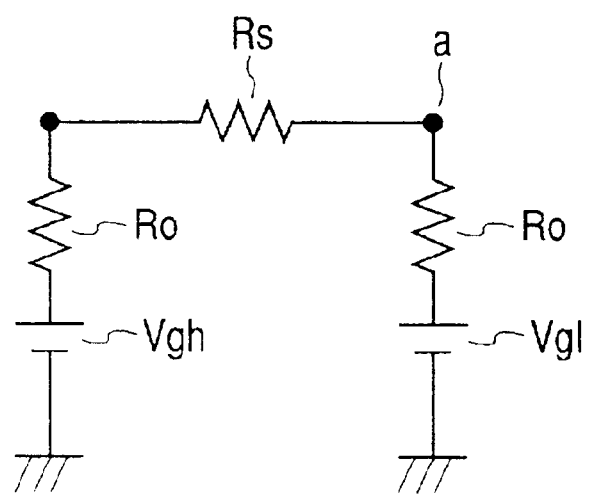
FIG. 9 is a schematic circuit diagram of an equivalent circuit of the third embodiment, illustrating the electric potential of the peripheral area of the driver for driving a TFT.

FIG. 9 is a schematic circuit diagram of an equivalent circuit of the second embodiment, illustrating the electric potential of the peripheral area of the driver for driving a TFT. Referring to FIG. 9, the adjacent lines can be held OFF if the potential Va of point "a" is lower than the threshold voltage Vth of the TFTS.

$$Vth > Va = Vg1 + (Vgh - Vg1) \times Ro/(Rs + 2Ro) \quad (1) \quad Rs > Ro(Vg1 - Vth - 2Vth)/(Vth - Vg1)$$

Since Vg1=−5V, Vgh=15V, Vth=2V and Ro=100 Ω; then Rs>86 Ω.

Similarly, as for the resistance Rv, since Vsh=9V at the time when the bias wires Vs of the optical sensors are used to read light, Vsh−Vg1=15V in conparison with Vgh−Vg1=20V above. Thus, any failure of the TFTs can be prevented by driving the Vs wires if at least Rv>Rs. If fluctuations of the Vs potential are to be held within the range in which no problem is caused with respect to the performance, they have to be less than 1%. Then, the resistance Rv needs to satisfy Rv>100×Ro. In this embodiment, it is satisfied if Rv>10 kΩ. As for Rvs, in order that fluctuations of the bias voltage of the optical sensors are less than 1%, Rvs need to statify Rvs>100×Ro.

Furthermore, if Vg1=0V in formula (1) above, the connection resistance Rgc between the Sc wire, or the slice check wire, and the Vg1 wire is equal to 550 Ω, or Rgc=550 Ω. Fluctuations of the bias voltage of the optical sensors can be held less than 1% if the connection resistance Rvs between the Sc wire and the Vs4 wire is greater than 100×Ro, or Rvs>100×Ro.

In this embodiment, any related wires can be connected by way of an ohmic (n+) layer. A standard value of 1MΩ is selected to provide each resistance with an enough margin.

Figure 10:
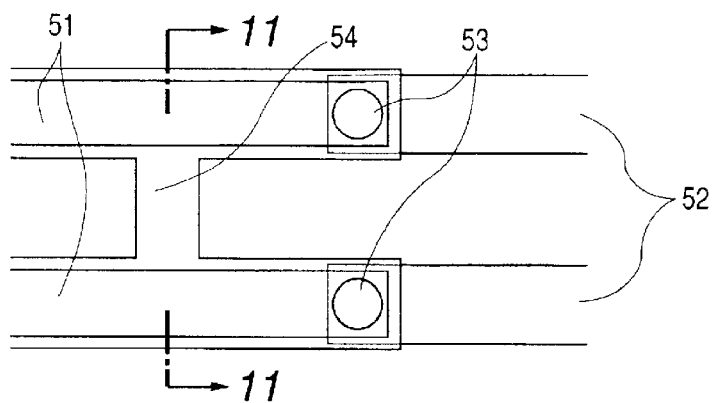
FIG. 10 is a schematic partial plan view of the third embodiment, illustrating the connection between TFT drive wires.

FIG. 10 is a schematic partial plan view of the third embodiment, illustrating how Vg wires are connected. In FIG. 10, reference numerals 51 and 52 respectively denote an Al wire and a Cr wire, whereas reference numerals 53 and 54 respectively denote a contact hole and an n+ connecting wire.

When connecting the Vg wires by way of an n+ layer, the Al wires are connected to the respective Cr wires by way of respective contact holes in order to reduce the wire resistance of the Vg wires in the areas other than the pixel region. The Al wires are connected by way of an n+ layer.

Figure 11:
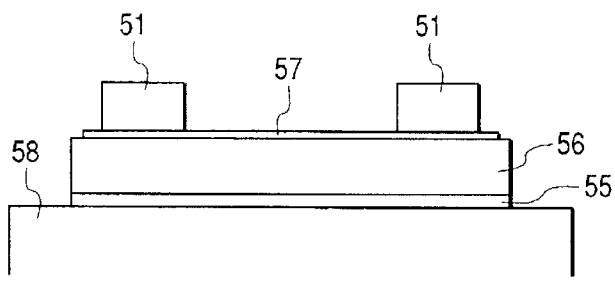
FIG. 11 is a schematic cross sectional view of the third embodiment taken along line 11—11 in FIG. 10.

FIG. 11 is a schematic cross sectional view of the third embodiment taken along line 11—11 in FIG. 10. In FIG. 11, reference numerals 58 and 55 respectively denotes a glass substrate and a gate insulating film and reference numerals 56 and 57 respectively denotes a semiconductor layer and an n+ ohmic contact layer. In this embodiment, the n+ layer is made to have a thickness of 1,000 Å as in the case of Embodiment 1 and has a sheet resistance of 100 kΩ/□. Since the pitch of pixel arrangement is 160 μm, the value of 1MΩ can be achieved by using ten or more than ten sheets. In this embodiment, any wires are connected with a clearance of 10 μm. Similarly, the Vs wires are connected by way of an n+ layer.

Figure 12:
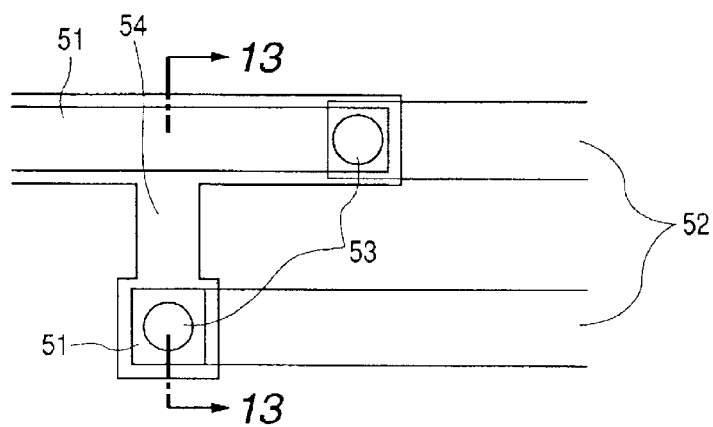
FIG. 12 is a schematic partial plan view of the third embodiment, illustrating the connection between a TFT drive wire.
Figure 13:
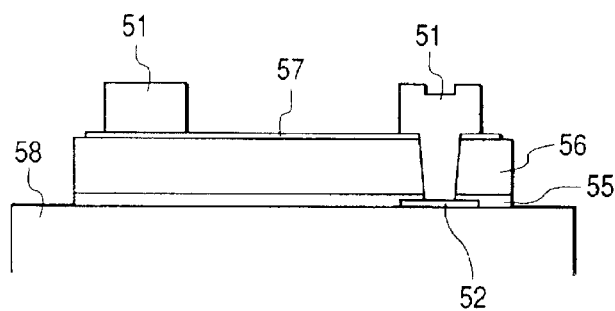
FIG. 13 is a schematic cross sectional view of the third embodiment taken along line 13—13 in FIG. 12.

Now, the technique of connecting a Vg wire and a slice check wire will be described below. FIG. 12 is a schematic partial plan view of the third embodiment, illustrating how a TFT drive wire and a slice check wire are connected. The slice check wire that is a Cr wire is connected to the Vg wire by way of a contact hole. FIG. 13 is a schematic cross sectional view of the third embodiment taken along line 13—13 in FIG. 12. The Vg wire 51 and the slice check line 52 are connected by way of contact hole 53. Here again, the n+ layer is so drawn as to make the wire resistance equal to 1MΩ. The slice check wire may be cut and removed in the area connecting the TFT drive wires and the photoelectric conversion element drive wires after checking the conductivity of the slice check line or simply left there if it does not interfere with the operation of the related elements by appropriately adjusting the connection area.

While the above embodiment is described in terms of TFTs used as functional elements, the present invention is by no means limited thereto and the TFTs may be replaced by diodes or thin film diodes.

(Fourth Embodiment)

Figure 14:
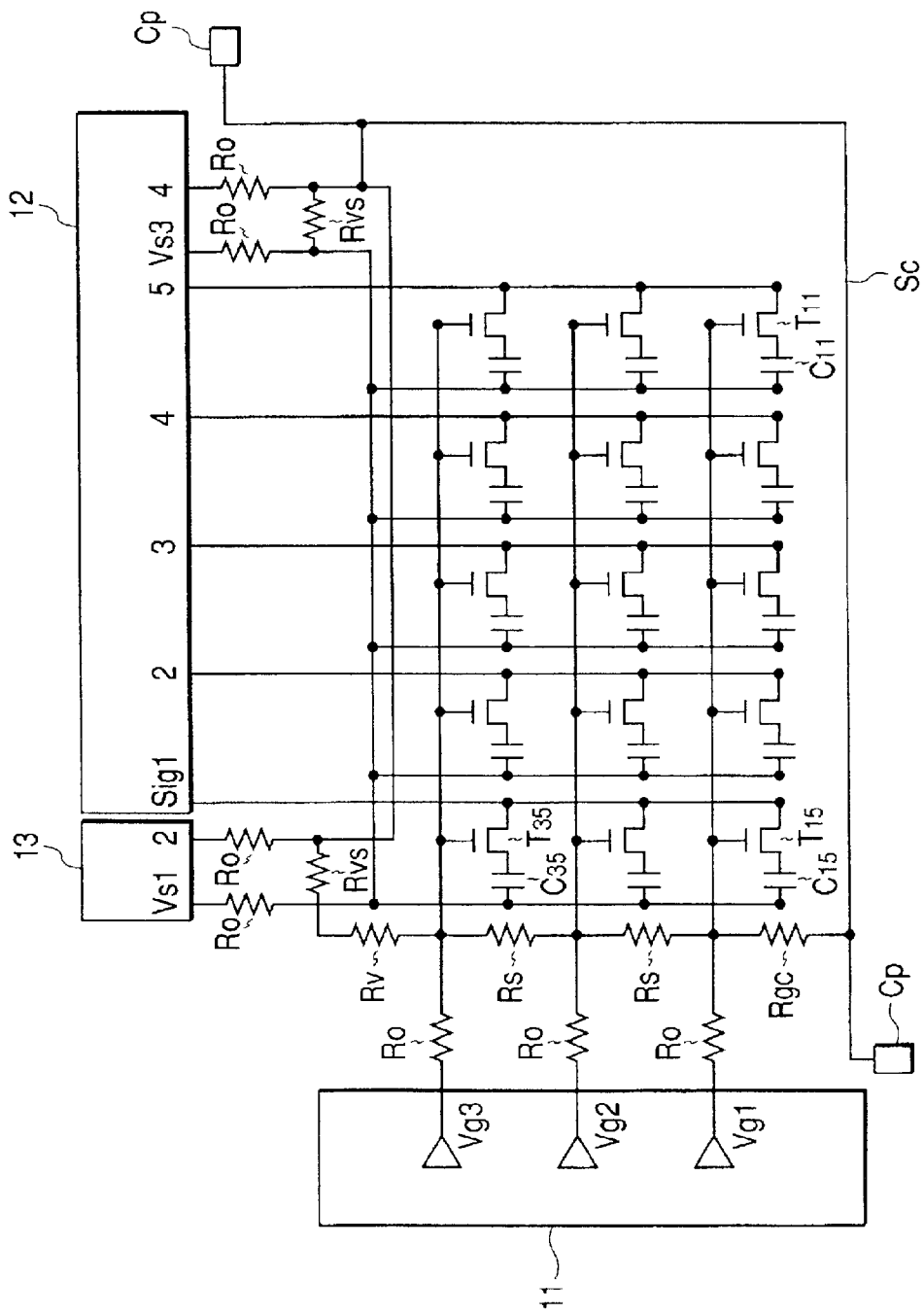
FIG. 14 is a schematic circuit diagram of an equivalent circuit of a fourth embodiment of the invention.
Figure 15:
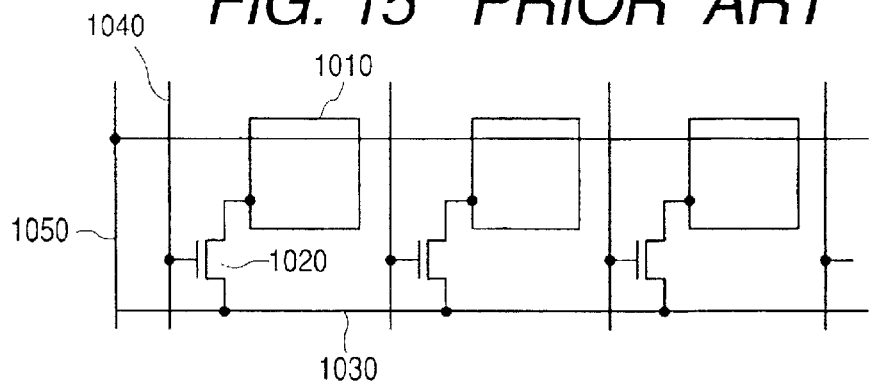
FIG. 15 is a schematic plan view of a known optical sensor.
Figure 16:
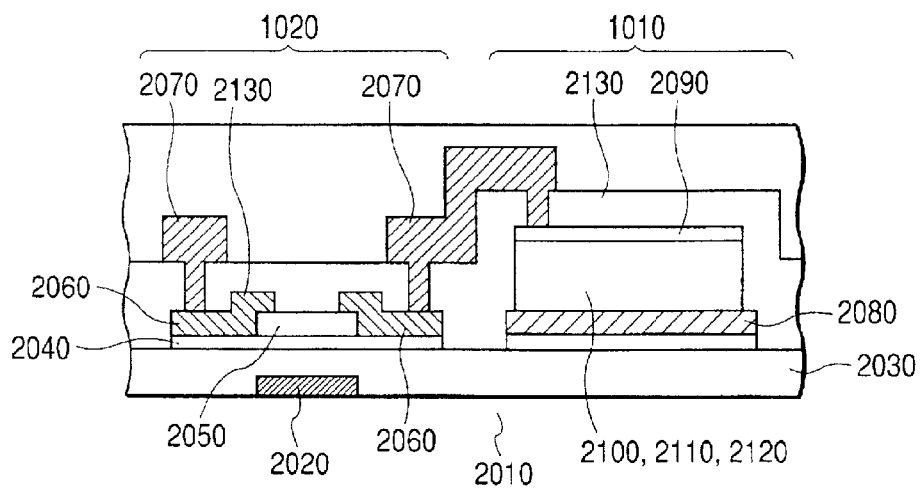
FIG. 16 is a schematic cross sectional view of a known PIN optical sensor.
Figure 17:
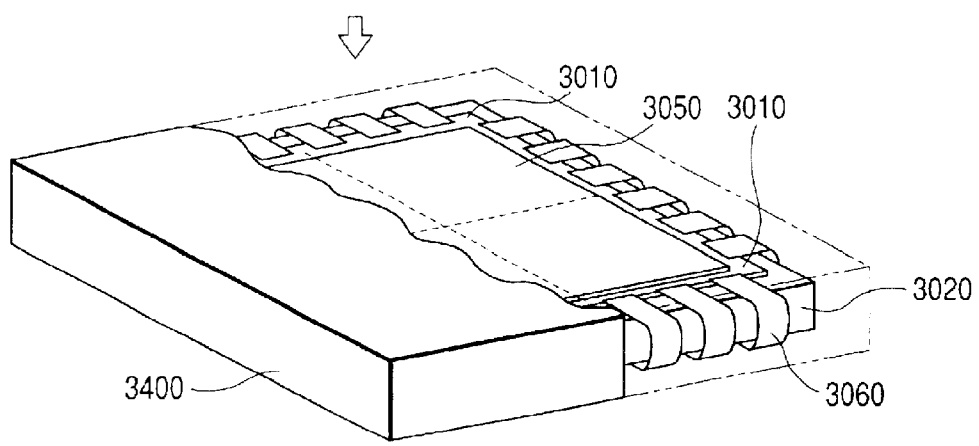
FIG. 17 is a schematic perspective view of a known radiation image reading apparatus.
Figure 18:
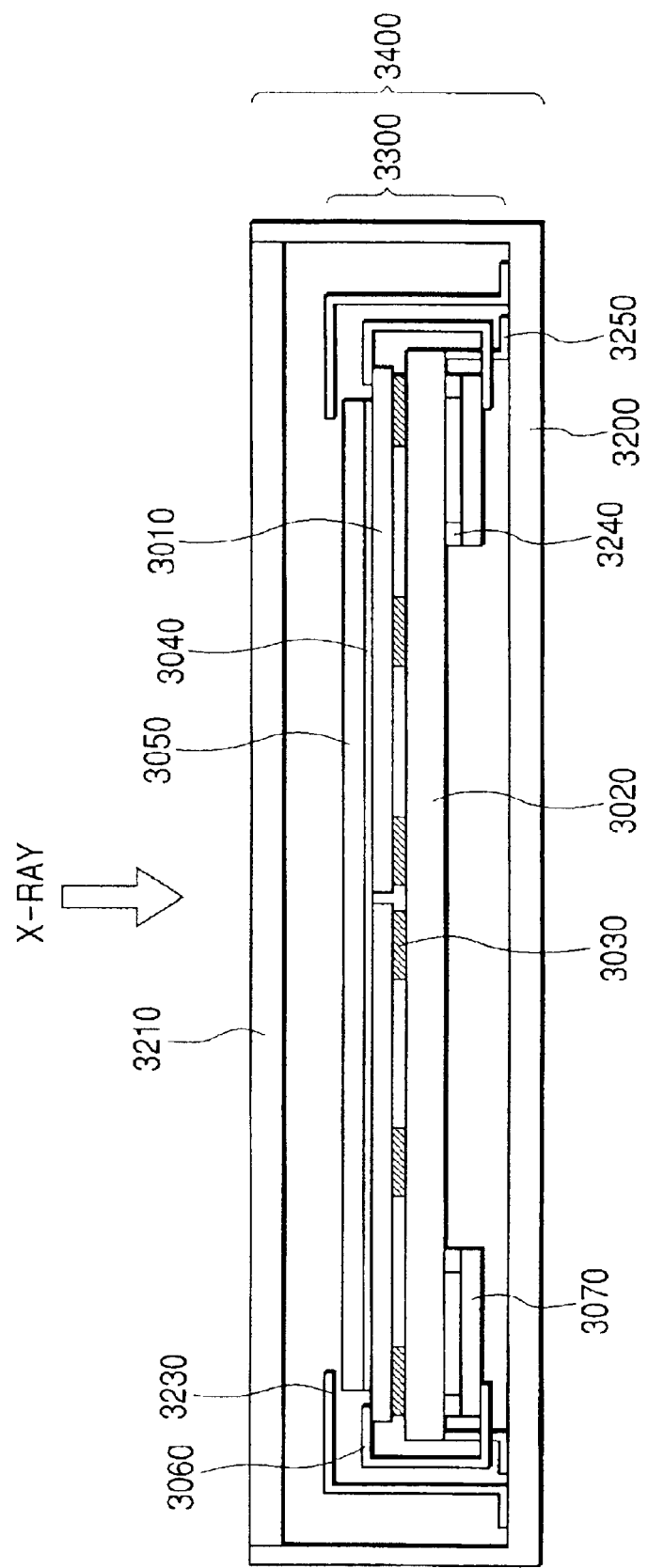
FIG. 18 is a schematic cross sectional view of the known radiation image reading apparatus of FIG. 17.
Figure 19:
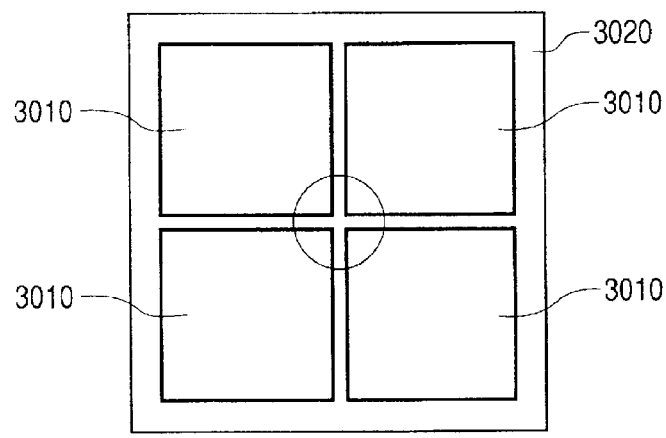
FIG. 19 is a schematic plan view of bonded panels.
Figure 20:
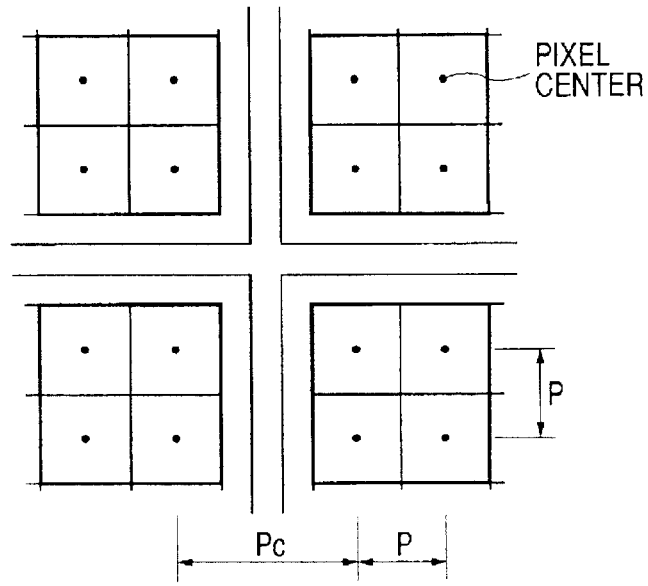
FIG. 20 is an enlarged schematic plan view of a central part of the bonded panels of FIG. 19.
Figure 21:
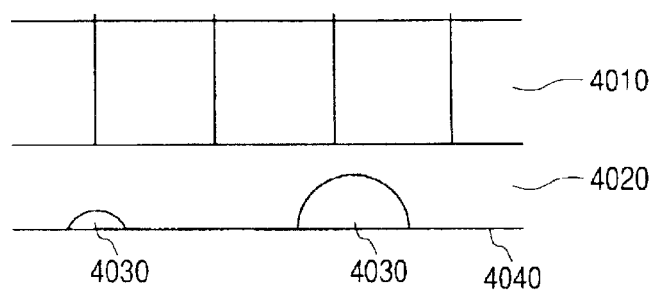
FIG. 21 is a schematic plan view of a cut area of a sensor panel.

Now the fourth embodiment of the invention will be described. In this embodiment, the slice check line and the Vs wires are connected without specifically providing any resistance. FIG. 14 is a schematic circuit diagram of an equivalent circuit of a fourth embodiment of the invention. In this embodiment, the Vs4 wire and the slice check wire Sc are connected in the same layer, although they may be alternatively arranged in different layers and connected between the different layers. Still alternatively, the Vs1 or Vs2 wire may be connected to the Sc wire. In this embodiment, the electric conductivity of the slice check wire is checked with a pad Cp for conductivity check to check defectives after cutting the panels, so that the slice check wire may be firmly held to a constant potential, which is not the ground potential, and hence the elements of the device can be protected against damages due to static electricity.

The present invention is also effective for narrowing the margins of liquid crystal panels. A liquid crystal panel is prepared by arranging a pair of glass substrates, forming elements on the substrates, cutting the substrates to desired dimensions, subsequently bonding the substrates and pouring liquid crystal in the space between the substrates. Then, electric components including drivers are mounted therein. Therefore, in the case of a liquid crystal again, defective products can be prevented from being mingled with good ones by connecting the slice check wire to the drive wires and examining the electric conductivity of the slice check wire. Additionally, the pixels can be protected against demages due to static electricity by connecting the TFT control lines to the slice check wire. Since normally a pair of substrates are bonded together and liquid crystal is poured into the gaps separating the substrates in the process of manufacturing liquid crystal panels, the conductivity check may be conducted either before or after bonding the substrates. For a liquid crystal panel, it is not necessary to keep the potential of the slice check wire constantly to the same level.

While the above embodiment is described in terms of TFTs used as functional elements, the present invention is by no means limited thereto and the TFTs may be replaced by diodes or thin film diodes.

(Fifth Embodiment)

Figure 22:
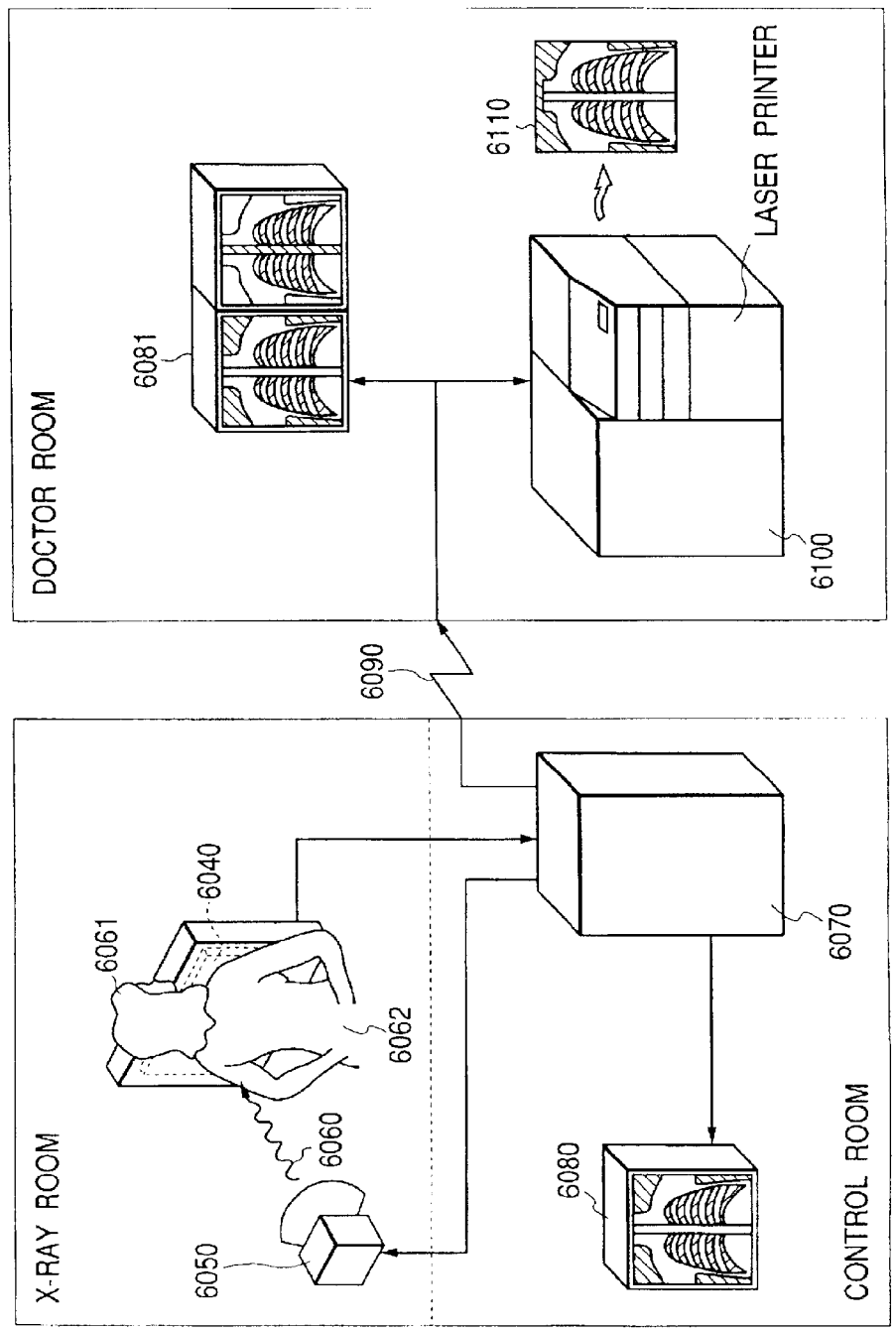
FIG. 22 is a schematic illustration of a system using a semiconductor device according to the invention for an X-ray examination apparatus.

FIG. 22 is a schematic illustration of a system using a semiconductor device according to the invention for an X-ray examination apparatus.

Referring to FIG. 22, X-rays 6060 generated by an X-ray tube 6050 are made to be transmitted through the chest 6062 of a patient or subject 6061, and enter the photoelectric converter 6040 provided on the surface with a fluorescent substance. For apparatus in which a substance (e.g. GaAs) having sensibility to radioactive rays such as X-ray is employed, however, the apparatus can sense radioactive rays and can be used as a radiation detection apparatus without providing a wavelength converter such as a fluorescent substance. The incoming X-rays contain information of the interior of the patient 6061. The fluorescent substance emits light as a function of the incoming X-rays and the photoelectric converter 6040 converts the emitted light into electric information, which is digitized and processed by an image processor 6070 so that it can be observed on a display 6080 in the control room.

The obtained information can be transferred to a remote site by way of an appropriate transmission means such as a telephone wire 6090 so that it may be displayed on a display 6081 in a doctor room of the remote site or stored in a storage means such as an optical disk. Therefore, the doctor at the remote site can diagnose the patient. The information may also be recorded on a film 6110 by means of a film processor 6100.

What is claimed is:

1. A photoelectric converter device having a plurality of pixels formed on a substrate, comprising:

a slice check wire for checking acceptability of a cut edge of said substrate, said slice check wire being arranged outside a region where said pixels are arranged and being disposed on a first wire layer among a plurality of wire layers, closest to said substrate, on said substrate.

2. The photoelectric converter device according to claim 1, wherein said wire is connected to a constant electric potential.

3. The photoelectric converter device according to claim 2, wherein said constant electric potential is the ground potential.

4. The photoelectric converter device according to claim 1, wherein said wire has a pad section for checking electric conductivity.

5. The photoelectric converter device according to claim 1, wherein said substrate is an insulator.

6. The photoelectric converter device according to claim 1, wherein said pixels carry a wavelength converter thereon.

7. The photoelectric converter device according to claim 6, wherein said wavelength converter is a fluorescent substance.

* * * * *

UNITED STATES PATENT AND TRADEMARK OFFICE
CERTIFICATE OF CORRECTION

PATENT NO. : 6,812,494 B2
DATED : November 2, 2004
INVENTOR(S) : Chiori Mochizuki et al.

It is certified that error appears in the above-identified patent and that said Letters Patent is hereby corrected as shown below:

Column 1,
Line 20, "paid" should read -- made --; and
Lines 35 and 42, "denotes" should read -- denote --.

Column 3,
Line 58, "convesion" should read -- conversion --.

Column 4,
Line 64, "is" should read -- are --.

Column 5,
Line 61, "mouting" should read -- mounting --.

Column 6,
Line 4, "bondig" should read -- bonding --;
Line 8, "TFTS." should read -- TFTs. --;
Lines 13 and 61, "denotes" should read -- denote --;
Line 16, "file 43" should read -- film 43 --;
Line 21, "liens" should read -- lines --;
Line 32, "means" should read -- means of --; and
Line 54, "on are" should read -- on one --.

Column 7,
Line 54, "TFTS." should read -- TFTs. --; and
Line 62, "conparison" should read -- comparison --.

Column 8,
Line 4, "statify" should read -- satisfy --;
Line 14, "an" should be deleted; and
Lines 28 and 30, "denotes" should read -- denote --.

UNITED STATES PATENT AND TRADEMARK OFFICE
CERTIFICATE OF CORRECTION

PATENT NO. : 6,812,494 B2
DATED : November 2, 2004
INVENTOR(S) : Chiori Mochizuki et al.

It is certified that error appears in the above-identified patent and that said Letters Patent is hereby corrected as shown below:

Column 9,
Line 43, "(e.g." should read -- (e.g., --.

Signed and Sealed this

Nineteenth Day of April, 2005

JON W. DUDAS
*Director of the United States Patent and Trademark Office*